(12) United States Patent
Agostini et al.

(10) Patent No.: US 8,763,681 B2
(45) Date of Patent: Jul. 1, 2014

(54) EVAPORATOR AND COOLING CIRCUIT

(75) Inventors: Francesco Agostini, Zofingen (CH); Berk Yesin, Zurich (CH); Bruno Agostini, Dietikon (CH)

(73) Assignee: ABB Research Ltd, Zurich (CH)

( * ) Notice: Subject to any disclaimer, the term of this patent is extended or adjusted under 35 U.S.C. 154(b) by 790 days.

(21) Appl. No.: 12/849,335

(22) Filed: Aug. 3, 2010

(65) Prior Publication Data
US 2011/0030400 A1 Feb. 10, 2011

(30) Foreign Application Priority Data
Aug. 5, 2009 (EP) .................................... 09167267

(51) Int. Cl.
*F28D 15/00* (2006.01)
*B01D 1/00* (2006.01)
*B01D 1/06* (2006.01)

(52) U.S. Cl.
USPC ................. 165/104.22; 165/911; 165/104.33; 165/104.29

(58) Field of Classification Search
USPC .............. 62/515, 524, 525, 119, 118; 159/29, 159/27.3, 4.1, 463; 202/176
See application file for complete search history.

(56) References Cited

U.S. PATENT DOCUMENTS

| | | | |
|---|---|---|---|
| 5,195,577 A | 3/1993 | Kameda et al. | |
| 5,203,399 A | 4/1993 | Koizumi | |
| 5,613,552 A | 3/1997 | Osakabe et al. | |
| 6,318,118 B2 * | 11/2001 | Hanson et al. | 62/512 |
| 6,415,619 B1 * | 7/2002 | Bash et al. | 62/228.4 |
| 2003/0010477 A1 | 1/2003 | Khrustalev et al. | |
| 2003/0188858 A1 | 10/2003 | Miyazaki et al. | |
| 2005/0082158 A1 * | 4/2005 | Wenger | 202/155 |
| 2006/0162376 A1 * | 7/2006 | Higashiyama et al. | 62/515 |
| 2007/0024132 A1 * | 2/2007 | Salamah et al. | 310/64 |
| 2007/0204983 A1 * | 9/2007 | Ichiyanagi | 165/176 |
| 2008/0128114 A1 * | 6/2008 | Lai et al. | 165/80.4 |
| 2008/0230797 A1 * | 9/2008 | Chang et al. | 257/99 |
| 2008/0264604 A1 * | 10/2008 | Campbell et al. | 165/80.4 |
| 2009/0108969 A1 * | 4/2009 | Sims et al. | 335/300 |
| 2009/0282861 A1 * | 11/2009 | Setoguchi et al. | 62/525 |
| 2010/0064717 A1 * | 3/2010 | Burn | 62/353 |

FOREIGN PATENT DOCUMENTS

DE 4116044 A1 11/1991
WO WO 03/006910 A1 1/2003

OTHER PUBLICATIONS

European Search Report issued on May 25, 2010, by European Patent Office as the International Searching Authority for European Application No. 09167267.5.

* cited by examiner

*Primary Examiner* — Allana Lewin
*Assistant Examiner* — Dawit Muluneh
(74) *Attorney, Agent, or Firm* — Buchanan Ingersoll & Rooney PC

(57) ABSTRACT

An evaporator for a cooling circuit is provided, for cooling at least one heat emitting device by evaporation of a cooling fluid. The evaporator includes a top collector, a bottom collector, and an evaporator body. The evaporator body includes at least one thermoconducting wall that is thermally connectable to the at least one heat emitting device, a plurality of evaporation channels, and a plurality of return channels.

45 Claims, 7 Drawing Sheets

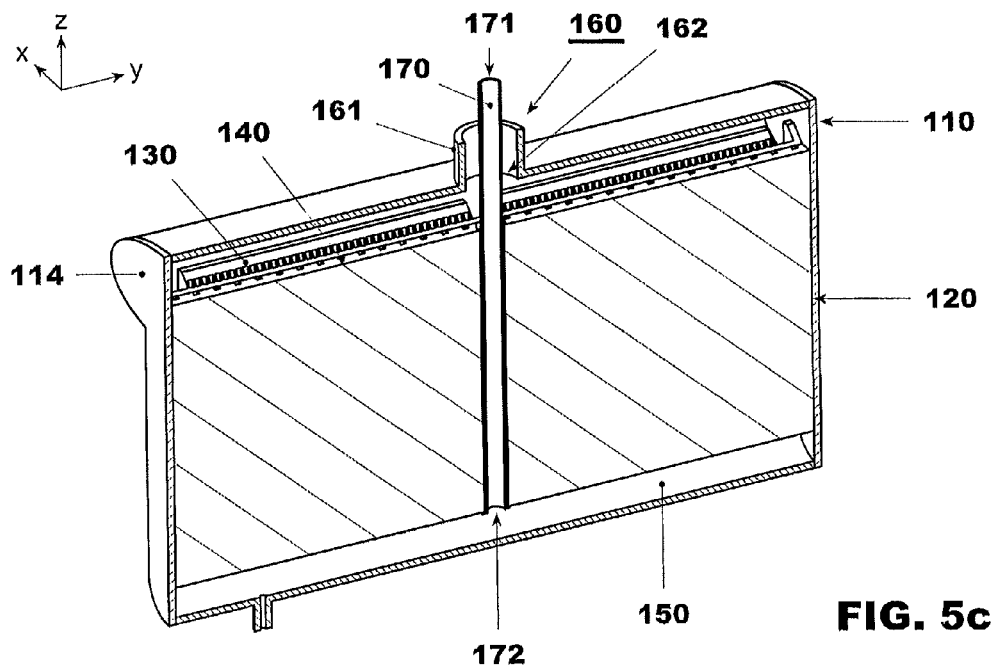
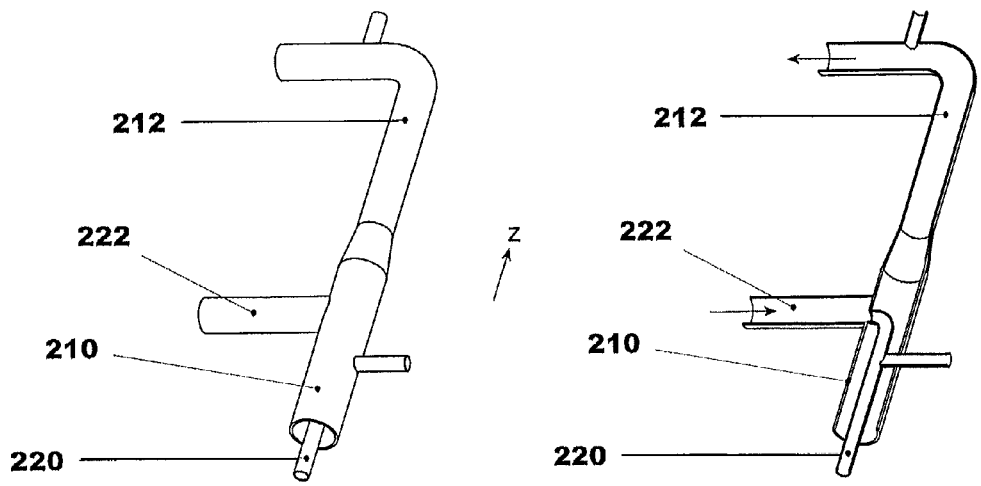
FIG. 6a   FIG. 6b

US 8,763,681 B2

EVAPORATOR AND COOLING CIRCUIT

RELATED APPLICATION

This application claims priority under 35 U.S.C. §119 to European Patent Application No. 09167267.5 filed in Europe on Aug. 5, 2009, the entire content of which is hereby incorporated by reference in its entirety.

FIELD

The disclosure relates to an evaporator for a cooling circuit, for example, a cooling circuit for cooling a heat emitting device by evaporation of a cooling fluid, to a cooling circuit and to a power module including such an evaporator, and to a method of cooling a heat emitting device by an evaporator.

BACKGROUND INFORMATION

As power electronic devices utilize more power and consequently dissipate more heat, efficient cooling of such power electronic devices is important. One way of providing an efficient cooling system for such power electronic devices, for example, semi-conductor switching elements, is providing a two-phase cooling circuit. Such a cooling circuit brings a liquid into thermal contact with a device emitting heat. The liquid is heated by dissipated heat of the device and reaches a boiling temperature. As the temperature of the liquid itself will not rise above the boiling temperature, the temperature of the liquid and therefore the temperature of the electronic device is kept at a temperature of the boiling point of the liquid as a maximum.

The liquid is stored in a reservoir inside an evaporator. The evaporator is in thermal contact with the heat emitting device. The vapor of the liquid is converged through a conduit to a condenser. Within the condenser the vapor is changed into liquid by rejecting heat. For example, in the condenser the heat is rejected to a coolant fluid, such as air at ambient temperature. The vapor thus returns to its liquid phase. The condenser and the evaporator are connected via a second line in order to feed back the condensed vapor as liquid again to the liquid reservoir of the evaporator.

Such a cooling device is disclosed in U.S. Pat. No. 5,195,577. A problem of such a cooling circuit can be that the evaporator at the same time provides the function of a liquid reservoir. Thus, the cross-section of such an evaporator can be relatively large. Consequently, the efficiency of the evaporator can be low because the introduced heat leads to boiling of the liquid which is provided in a large volume of the evaporator. This so-called "pool boiling" has poor heat transfer performance, is bulky, requires a large fluid inventory, and can be difficult to make leak proof at high pressure.

To improve the heat transfer performance of an evaporator it has been considered to use the so-called convection-boiling. In order to achieve the convection-boiling effect the cross section of the evaporator is reduced. Due to the reduction of the cross section of the evaporator a mixture of a gas phase and the liquid phase at the exit of the evaporator flows to the condenser. By introducing the vapor mixture to the condenser with the vapor containing liquid droplets, the performance of the condenser can be decreased. So the positive effect of reduction of the cross section area of the evaporator can be reduced to a large extent by the poor heat transfer performance of the condenser.

Thus, there is a need for an evaporator for a cooling circuit with an improved heat transfer without affecting the performance of a condenser of the cooling circuit. It is desirable that there is sufficient liquid phase cooling fluid available in the evaporation channels so that the evaporator does not run dry during operation.

SUMMARY

An evaporator for a cooling circuit for cooling at least one heat emitting device by evaporation of a cooling fluid is disclosed. The evaporator includes a top collector having a volume for receiving the cooling fluid therein, a bottom collector having a volume for receiving the cooling fluid therein, and an evaporator body, includes at least one thermoconducting wall that is thermally connectable to the at least one heat emitting device. A plurality of evaporation channels are in thermal contact with the at least one thermoconducting wall and are fluidly connected to the bottom collector and to the top collector. Each of the evaporation channels including a respective evaporation channel intake for intaking cooling fluid from the bottom collector in an operating state of the evaporator, and a respective evaporation channel outlet for letting out the cooling fluid to the top collector in the operating state. The evaporation channels are dimensioned for establishing boiling of the liquid cooling fluid in the evaporation channels in the operating state, so that in the operating state the cooling fluid therein is at least partially turned into vapor, and for establishing bubble pumping so that the cooling fluid is then driven out from the evaporation channels via the respective evaporation channel outlets to the top collector. A plurality of return channels are fluidly connected to the bottom collector and to the top collector. Each of the return channels includes a respective return channel intake for intake of the cooling fluid from the top collector in the operating state, and a respective return channel outlet for letting out the cooling fluid to the bottom collector in the operating state.

An evaporator for a cooling circuit for cooling at least one heat emitting device by evaporation of a cooling fluid is disclosed. The evaporator includes a top collector having a volume for receiving the cooling fluid therein, a bottom collector having a volume for receiving the cooling fluid therein, a liquid outlet port at the bottom collector connectable to a condenser of the cooling circuit for letting in cooling fluid from the condenser to the bottom collector in an operating state of the evaporator, and an evaporator body including, at least one thermoconducting wall that is thermally connectable to the at least one heat emitting device. At least one evaporation channel(s) is in thermal contact with the at least one thermoconducting wall and is fluidly connected to the bottom collector and to the top collector. Each of the evaporation channel(s) includes a respective evaporation channel intake for intake of the cooling fluid from the bottom collector in the operating state, and a respective evaporation channel outlet for letting out the cooling fluid to the top collector in the operating state. At least one return channel(s) is fluidly connected to the bottom collector and to the top collector. Each of the return channel(s) includes a respective return channel intake for intake of the cooling fluid from the top collector in the operating state, and a respective return channel outlet for letting out the cooling fluid to the bottom collector in the operating state.

A method of cooling a heat emitting device by an evaporator including a top collector, a bottom collector and an evaporator body with at least one thermoconducting wall, a plurality of evaporation channels and a plurality of return channel and a cooling fluid in the evaporation channels is disclosed. The method includes transferring heat from the heat emitting device via the thermoconducting wall to the plurality of evaporation channels, boiling of the liquid cooling fluid in the evaporation channels, so that the cooling fluid therein is at least partially turned into vapor, bubble pumping the liquid cooling fluid in the evaporation channels, so that the cooling fluid therein is driven out from the evaporation channels to the top collector, and replaced by liquid cooling fluid entering the evaporation channels from the bottom collector, and returning a liquid portion of the cooling fluid from the top collector to the bottom collector via the plurality of return channels, wherein the liquid portion forms a predominantly liquid portion.

BRIEF DESCRIPTION OF THE DRAWINGS

The details will be described in the following with reference to the figures, wherein:

FIG. 2b is a cross-sectional perspective view of the evaporator of FIG. 2a;

FIGS. 5b and 5c are cross-sectional perspective views of the evaporator of FIG. 5a;

FIGS. 6a and 6b are a perspective view and a cross-sectional view, respectively, of the inlets and outlets of the condenser of the exemplary cooling circuit shown in FIG. 1; FIG. 7b is a perspective cross-sectional view of the evaporator of FIG. 7a.

DETAILED DESCRIPTION

Figure 1:
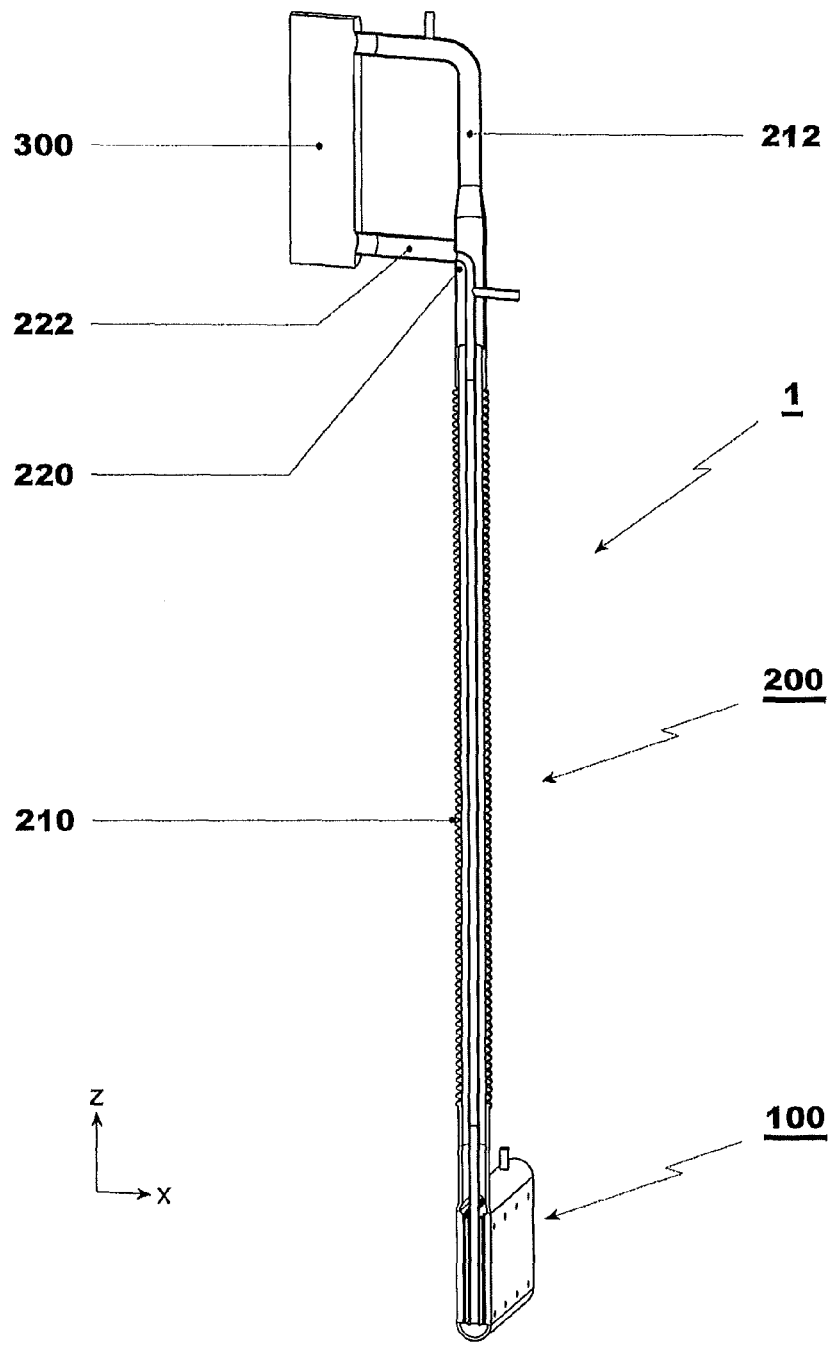
FIG. 1 is a perspective view of a cooling circuit according to an exemplary embodiment of the disclosure.

According to an exemplary embodiment, an evaporator for a cooling circuit for cooling at least one heat emitting device by evaporation of a cooling fluid is provided. The evaporator includes a top collector having a volume for receiving the cooling fluid therein, a bottom collector having a volume for receiving the cooling fluid therein, and an evaporator body. The evaporator body includes at least one thermoconducting wall that can be thermally connectable to the at least one heat emitting device. A plurality of evaporation channels can be in thermal contact with the at least one thermoconducting wall and can be fluidly connected to the bottom collector and to the top collector. Each of the evaporation channels can include a respective evaporation channel intake for intake of the cooling fluid from the bottom collector in an operating state of the evaporator, and a respective evaporation channel outlet for letting out the cooling fluid to the top collector in the operating state. The evaporation channels can be dimensioned for establishing boiling of the liquid cooling fluid in the evaporation channels in the operating state, so that in the operating state the cooling fluid therein can at least partially be turned into vapor, and for establishing bubble pumping so that the cooling fluid can be driven out from the evaporation channels via the respective evaporation channel outlets to the top collector. A plurality of return channels can be fluidly connected to the bottom collector and to the top collector. Each of the return channels can include a respective return channel intake for intake of the cooling fluid from the top collector in the operating state, and a respective return channel outlet for letting out the cooling fluid to the bottom collector in the operating state.

A benefit of the evaporation channel geometry described above can be that the heat transfer between the heat emitting device and the cooling liquid inside the evaporator as well as the fluid circulation can be improved by the evaporation channel geometry enabling bubble pumping.

Also, a benefit of the liquid return channels can be that they allow liquid cooling fluid, which may be present in the top collector or which may enter the top collector from the evaporation channels, to return to the bottom collector quickly and in an evenly distributed manner, such that the risk of the evaporator running dry can be reduced, even under strong thermal load. This includes the risk of the evaporator running dry locally.

Furthermore, due to the bubble pumping, the convective movement of the fluid can be improved. Hence, it is in some cases not necessary to provide a pump or the like in order to supply a sufficient amount of liquid and to keep up the cooling fluid circulation at a sufficient level.

According to a second aspect, there can be provided an evaporator as in the previous embodiment, but the evaporation channel dimension can be given in absolute values instead of being defined in terms of bubble pumping. Specifically, the evaporation channels can have a traverse cross-section as defined anywhere within this description. For example, the traverse cross-section can have at least one of the following:

a smallest transverse channel dimension within the cross section being between 0.25 mm and 25 mm, between 0.5 mm and 10 mm, or between 1 mm and 6 mm;

a transverse channel size of less than 25 mm, or less than 10 mm, in a transverse direction orthogonal to the thermoconducting wall, or a transverse cross-sectional aspect ratio, i.e. a maximum channel width in the transverse direction divided by a minimum channel width in the transverse direction, between 1 and 10, between 1 and 5 or between 1 and 2.

These dimensions facilitate a heat transfer to the cooling fluid within the channels, because they make sure that a large fraction of the cooling fluid can be in close proximity to the channel wall. The small aspect ratio allows channel side walls to contribute substantially to the heat transfer to the fluid, thus increasing the cooling efficiency of the evaporator.

According to an exemplary embodiment, a cooling circuit for cooling at least one heat emitting device by evaporation of a cooling fluid can be provided. The cooling circuit can include an evaporator (100) as described anywhere herein—which does not exclude that there may be more than one evaporator; a condenser (300) having a coupling portion for thermally coupling the condenser to a heat sink; and a hose—which, again, does not exclude that there may be more than one hose—including a first hose portion connecting the evaporator (100) to the condenser (300) for delivering vaporous cooling fluid from the top collector to the condenser in the operating state; and a second hose portion connecting the condenser (300) to the evaporator (100) for delivering liquid cooling fluid from the condenser to the bottom collector (150) in the operating state. The cooler circuit can also include the cooling fluid.

According to an exemplary embodiment, a method of cooling a heat emitting device (2) by an evaporator can be provided.

Generally, the gas flow from the evaporation channels can also transport a certain amount of the liquid phase to the top collector. Therefore, in exemplary embodiments, the top collector can have a separation volume for separating, in the operating state, a predominantly liquid portion from a predominantly vaporous portion of the cooling fluid. The separation volume can be located at a vapor exiting port of the evaporator channel. The separation volume can keep liquid phase fraction from being conveyed from the top collector to the condenser. Thus, unwanted feeding of liquid into the condenser can be avoided.

Instead, the return channels can be provided for returning the liquid fraction to the bottom collector. There can be a plurality of return channels, so that a sufficient and well-distributed supply of liquid can be provided, even if, for example, one of the return channels is clogged.

Further, a sufficient supply of liquid can also be promoted by providing the evaporator inlet port at the bottom collector connectable to a condenser of the cooling circuit. This arrangement allows cooling fluid from the condenser to be let in directly to the bottom collector, without unnecessary fluid being introduced to the top collector.

Exemplary embodiments are also directed to methods of manufacturing the disclosed evaporator and cooling circuit.

Further advantages, features, aspects and details that can be combined with embodiments described herein are evident from the, the description and the drawings.

Reference will now be made in detail to the various embodiments, one or more examples of which are illustrated by each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, like reference numbers refer to like or to functionally similar components. Generally, only the differences with respect to the individual embodiments are described. Unless specified otherwise, the description of a part or aspect in one embodiment applies to a corresponding part or aspect in another embodiment as well.

Overview and Operation of the Cooling Circuit

FIG. 1 is a cross-sectional perspective view of a two-phase cooling circuit according to an exemplary embodiment of the disclosure. The cooling circuit 1 includes an evaporator 100, a hose 200, and a condenser 300 connected to the evaporator 100 via the hose 200. The hose 200 includes an inner hose 220 and an outer hose 210 coaxially arranged around the inner hose 220. The outer hose 210 fluidly connects a vapor outlet port 162 of the evaporator 100 (see FIG. 2a) to a condenser inlet 212 of the condenser 300. Further, the inner hose 220 fluidly connects a condenser outlet 222 of the condenser 300 to a liquid inlet port 171 of the evaporator 100 (see FIG. 2a).

During operation, the cooling circuit can operate as a two-phase thermosyphon in the following manner. The evaporator 100 absorbs heat from a heat emitting device such as a power module attached thereto. The heat produces a (partial) phase change of a cooling fluid, from a liquid phase to a gaseous phase, within the evaporator 100. The fluid may be any known refrigerant or any other suitable fluid. The resulting vapor (i.e. the cooling fluid in the gaseous phase) is then let out of the evaporator 100, via the vapor outlet port 162 (see FIG. 2a), the outer hose 210, and the condenser inlet 212, to the condenser 300. In the condenser 300, the vaporous cooling fluid condenses into the liquid phase again, thereby emitting the associated condensation heat to a heat sink coupled to the condenser. Subsequently, the liquid cooling fluid is transported back via the condenser outlet 222 and the inner hose 220 to the evaporator, into which it enters via the liquid inlet port 171 (see FIG. 2a). Consequently, the evaporator can be described as a two-phase evaporator.

Here, the phase change of the cooling fluid described above may not be complete, i.e., there may still be, for example, liquid droplets in the gaseous phase of the cooling fluid. Herein, a gaseous phase can refer to a predominantly gaseous phase which may nevertheless include some liquid, for example, in the form of droplets but whose flow properties are dominated by the gaseous phase. Similarly, a liquid phase can refer to a predominantly liquid phase.

The cooling circuit of FIG. 1 can be a gravitational thermosyphon, i.e., the evaporator 100 is in a vertical bottom position and the condenser 300 is in a vertical top position (as indicated by the z axis in FIG. 1). In this manner, gravity can help maintain the cooling fluid circulation described above, because the vaporous cooling fluid can be moved vertically (in z direction) upwardly due to its buoyancy. The liquid cooling fluid returning from the condenser 300 to the evaporator 100 can be moved down vertically downwardly due to its higher mass density. In general, herein the z axis can be defined by the longitudinal extension of the evaporation channels (see below), and the top direction can be the direction of evaporation during normal operation.

The evaporator could also be mounted in an inclined or even in a horizontal orientation (relative to the earth's surface). Still, in this case the top, bottom etc. can be defined herein by the direction of flow of the evaporated fluid in the evaporation channels. For example, when the evaporator is mounted in a horizontal orientation relative to the earth's surface, the evaporated cooling liquid in the evaporation channel can still be pumped toward the top collector if the liquid column provides sufficient pressure, thus justifying the term "top" collector.

For purposes of description herein, the terms "upper", "lower", "left", "rear", "right", "front", "vertical", "horizontal", and derivatives thereof shall relate to the disclosure as oriented in the figures. However, it is to be understood that the disclosure may assume various alternative orientations as long as the function of the thermosyphon and parts thereof is maintained in the sense of the present disclosure.

First Exemplary Embodiment of an Evaporator

Overall Design.

Figure 2A:
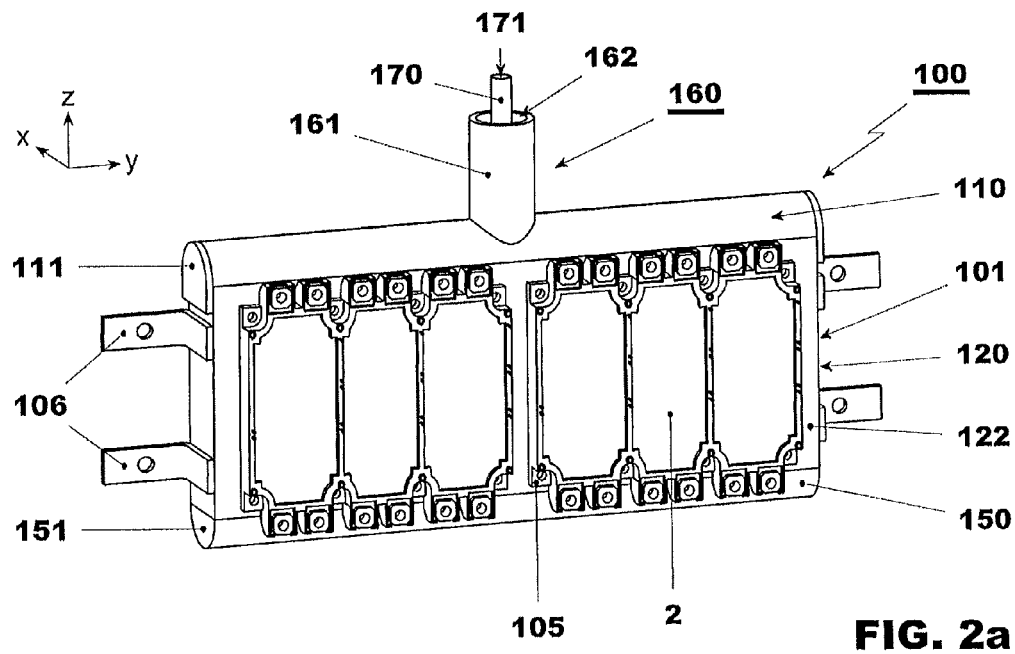
FIG. 2a is a perspective view of an exemplary embodiment of an evaporator of the cooling circuit of FIG. 1.
Figure 2B:
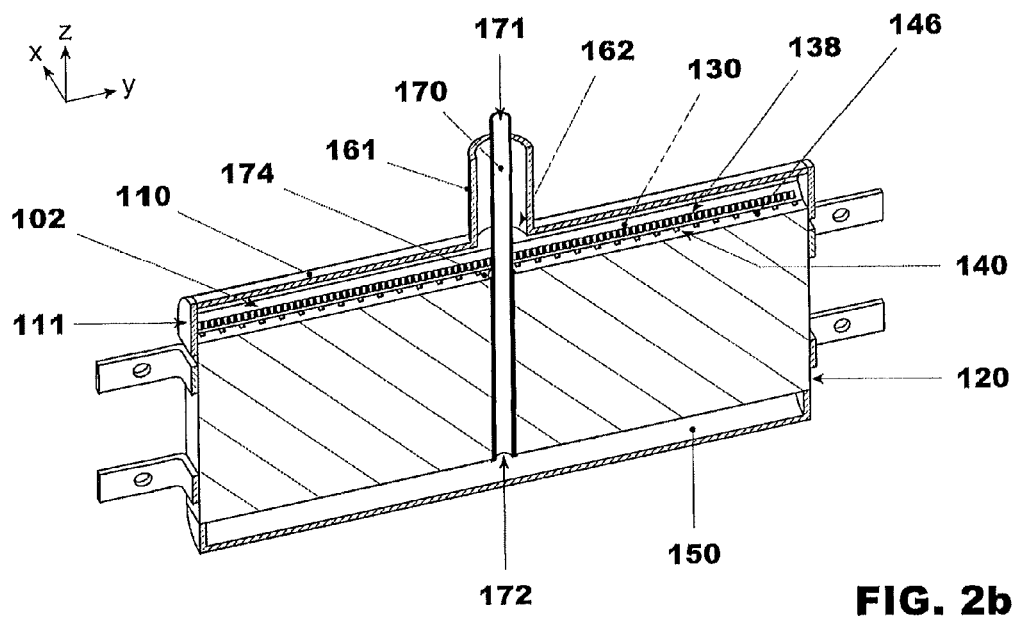

Referring to FIGS. 2a and 2b, the evaporator 100 is now described in more detail. Here, reference is made to the orthogonal x-y-z coordinate system shown in FIG. 2a and the other Figures, wherein the z axis denotes a direction of longitudinal extension of the evaporation channels 130 (see below), and wherein the x axis denotes the direction normal to the evaporator wall 122 (see below).

The evaporator 100 has an evaporator housing 101 including an inner volume for the cooling fluid. The interior volume can be accessible through a connector 160 forming a functional port for the vaporous and liquid condensate. Besides the connector 160, the interior volume of the evaporator 100 can be closed in a fluid-tight manner such as to contain the cooling fluid therein. The connector 160 includes an outer connector tube 161 that laterally encompasses an inner connector tube 170 in a coaxial manner with reference to an axis defined by the cylindrical shape of the connector 160. The cavity between the outer connector tube 161 that laterally encompasses the inner connector tube 170 can have a ring shaped cross section and serves as a vapor outlet port 162. The inner connector tube 170 includes the liquid inlet port 171 from where the condensated liquid/coolant can run to the liquid outlet port 172 and further to the actual evaporating portion to be evaporated again in a closed loop manner.

At least three sections of the evaporator 100 can be distinguished. The evaporator includes a top collector 110, a bottom collector 150, and an evaporator body 120 arranged in between the top collector 110 and the bottom collector 150. The top collector 110 has an interior top collector volume, and the bottom collector 150 has an interior bottom collector volume, for accommodating the cooling fluid therein. The interior volume of the top collector 110 can be delimited by a top collector housing 111 being part of the evaporator housing 101, and by a portion of the evaporator body 120. The interior volume of the top collector 110 can be in direct fluid communication with the vapor outlet port 162 located within the outer connector tube 161 that is attached to the top collector housing 111. Further, the bottom collector 150 can be delimited by a bottom collector housing 151, and by a portion of the evaporator body 120.

The evaporation body 120 can include a thermoconducting evaporator wall 122 that is thermally connected to power modules 2 attached to the wall 122. Here, the power modules 2 are the heat emitting devices to be cooled by the cooling circuit. As a general aspect, the size of the thermoconducting wall 122 can be between 200 mm and 2000 mm in the y direction and in the z direction. In an exemplary embodiment, the size can be about 400 mm (in z direction) by 800 mm (in y direction). This size can be suitable for power modules. The size in x direction can be, in exemplary embodiments, between 50 mm and 400 mm, or between 100 and 200 mm. In other exemplary embodiments, the size of the thermoconducting wall and of the entire evaporator can be much smaller, for example, when the evaporator is adapted for components of portable equipment such as a notebook.

The evaporation body 120 can further include a plurality of evaporation channels 130 and a plurality of liquid return channels 140. The channels 130, 140 run through the evaporator body 120 and fluidly connect the top collector 110 and the bottom collector 150 to each other. The evaporation channels 130 can be arranged closer to the evaporator wall 122 than the liquid return channels 140. The evaporation channels 130 and the return channels 140 can be arranged mutually parallel and extending in a vertical direction (z direction).

The interior volume of the evaporator 100 can contain a cooling fluid (not shown in FIG. 2a), part of the cooling fluid being in a liquid phase and part of the cooling fluid being in a vaporous phase. The liquid phase tends to be in a bottom portion of the evaporator, and the vaporous phase tends to be in a top portion, due to its lower mass density, generally separated by a liquid level, which may however be somewhat blurry especially within the evaporation channels due to for example, bubble formation.

The evaporator 100 is designed such that it works for a broad range of liquid levels. Generally, the liquid level can be at any height (in vertical z direction) between the inlets 136 of the evaporation channels 130 and the vapor outlet port 162. This wide range can allow for reliable operation during various operational conditions. Generally, the liquid level can be such that there is a liquid level column within the liquid return channels 140 and/or within the liquid return tube 170 during operating conditions, the liquid column being sufficiently high to sustain or support the circulation of the cooling fluid.

During operation, the evaporation channels 130 take in liquid cooling fluid (i.e., predominantly liquid cooling fluid, see above) from the bottom collector 150. The liquid cooling fluid can then be evaporated within the evaporation channels 130. As a result, the cooling liquid can be at least partially turned into vapor, i.e. gas, so that a two-phase mixture of liquid and gaseous cooling fluid is generated (also, in some embodiments a predominantly gaseous cooling fluid can be generated, but for simplicity only the case of a two-phase mixture shall be explained). The resulting at least partially vaporous cooling fluid can then be driven towards the top collector due to its buoyancy, and thereby a mass flow of cooling fluid in a two-phase mixture to the top collector 110 can be generated.

In the top collector 110, a gaseous phase (i.e. a predominantly gaseous phase) portion of the cooling fluid can be separated from a liquid phase (i.e. a predominantly liquid phase) portion of the cooling fluid. The return channels 140 serve to return the liquid phase portion of the cooling fluid from the top collector 110 to the bottom collector 150.

Therefore, in view of their function described above, the ends of the evaporation channels 130 at the side of the bottom collector 150 (ends 136 shown in FIG. 3) can be called evaporation channel intakes, and the ends 138 at the side of the top collector 110 can be called evaporation channel outlets. Likewise, the ends 146 of the return channels 140 at the side of the top collector 110 can be called return channel intakes for intake of the cooling fluid, and the ends 148 (see FIG. 3) of the return channels 140 at the side of the bottom collector 150 can be called return channel outlets.

Evaporation Body 120, Channels 130, 140

Now, the evaporation body 120 and the channels 130, 140 therein, shown in FIG. 2b, are described in more detail. The evaporation channels 130 can be delimited by four respective channel walls per channel, the channel walls extending essentially along a length of the channels. Of these channels walls, not only the channel wall closest to the evaporator wall 122, but also the two channel walls adjacent to it can contribute substantially to the heat transfer from the evaporator wall 122 to the cooling fluid inside the channels. In an exemplary embodiment at least these three channel walls of the evaporation channels and the evaporator wall 122 can be formed as walls of a single one-piece body (here, of the evaporator body 120). This can allow for a good heat transfer from the evaporator wall 122 to at least these three channel walls.

The evaporation channels 130 can be arranged in closer proximity to the (closest) evaporator wall 122 than the return channels 140. For example, the evaporation channels 130 can be arranged between the return channels 140 and the evaporator wall 122. This arrangement can help the evaporation channels 130 to absorb the heat coming from the evaporator wall 122 efficiently, and thereby to shield the liquid return channels 140 from the heat from the evaporator walls 122, thus avoiding a boiling of the cooling fluid in the return channels 140.

The plurality of evaporation channels 130 can extend in parallel to each other in the z direction. Further, the plurality of evaporation channels 130 can be arranged in a linear row along the y direction. Similarly, also the return channels 140 can extend parallel to each other in the z direction and can be arranged in a linear row along the y direction.

Further, neighboring evaporation channels 130 can be separated only by a small spacing. For example, the spacing between two neighboring evaporation channels 130 in the y direction can be less than the cross-sectional extension of one evaporation channel 130 in the y direction. This arrangement can allow the heat from the heat emitting device to be absorbed efficiently by the evaporation channels 130.

The evaporator of FIGS. 2a and 2b, has two thermoconducting walls 122 at which heat emitting devices can be attached and cooled. For example, not only the wall 122 shown in FIG. 2a, but also the wall opposite thereto is such an evaporator wall. Thus, the evaporator can be mirror symmetric with respect to the cross-sectional y-z plane of FIG. 2b. The further rows of evaporation channels 130 and liquid return channels 140, not visible in the cross-sectional view of FIG. 2b, can be seen from FIG. 3.

Figure 4A:
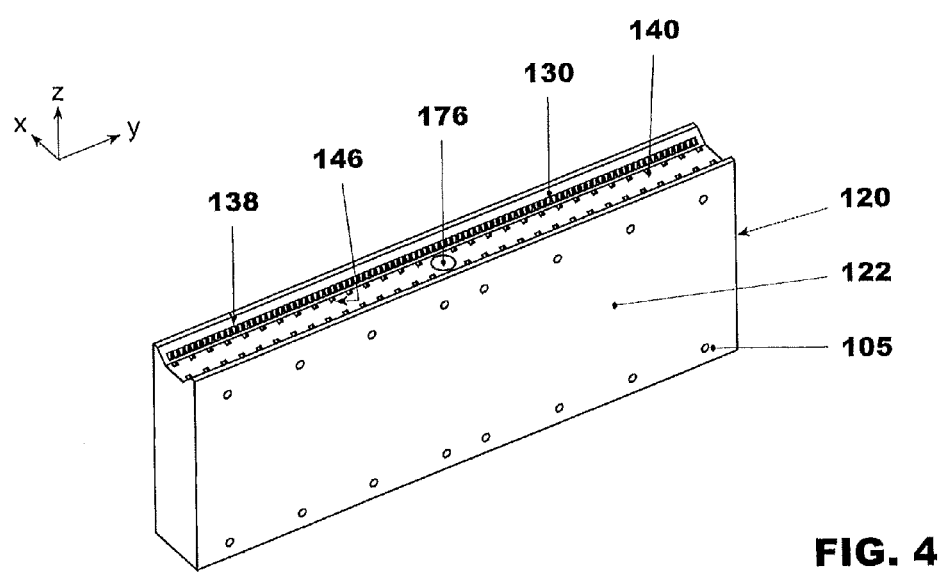
FIG. 4a is a perspective view of the evaporator body shown in FIG. 3.

The evaporator body 120 can be made of a single piece in the embodiment shown in FIG. 4a. Thus, the evaporating channels and the liquid return channels can be physically provided in the evaporator body 120 being a one-piece unit. This can have the advantage that good heat transfer from the evaporator wall 122 to the channels, in particular the evaporation channels 130, can be achieved. The evaporator body 120 can be made, for example, of a metal such as aluminum or copper, for example, by extrusion. In this way, also the thermoconducting wall 122 can be part of the one piece evaporator body 120.

The evaporation channels 130 can be designed such that during operation, the liquid cooling fluid can be evaporated within the evaporation channels 130 by boiling, in some embodiments by convection boiling.

The channels can also be transversally small so that the vapor bubbles generated due to the boiling create a bubble pumping effect, with the evaporation bubbles creating a mass flow due to their buoyancy such that a two-phase mix of liquid and vapor can be driven out of the evaporation channels.

Generally, the evaporation channel dimension allows for bubble pumping if the channels have a size (in at least one transverse direction, x or y) that is of the same order of magnitude as a bubble size of an evaporated bubble of the cooling fluid.

The evaporation channels 130 can be thin not only in the x direction, but also in the y direction. Their size in any transverse direction (x and/or y direction) can be less than 25 mm, less than 10 mm, or even less than 8 mm. The channel size in any transverse direction can be more than 0.25 mm, more than 0.5 mm or more than 1 mm, such as to allow good movement of the cooling fluid therein. The channel cross-section (in a plane orthogonal to the lengthwise channel extension) can be less than 100 mm$^2$, less than 50 mm$^2$, or less than 20 mm$^2$. As a further general aspect, the channel cross-section can be more than 0.1 mm$^2$ or more than 1 mm$^2$.

Further, generally the transverse cross-sectional aspect ratio, i.e. a maximum channel width in the transverse direction divided by a minimum channel width in the transverse direction, can be between 1 and 5, or between 1 and 2. This means that the channel dimensions in x and y direction are not too different from one another. Thereby, not only the channel wall facing the evaporator wall 122, but also the side channel walls neighboring it may contribute substantially to the heat transfer from the evaporator body 120 to the cooling fluid, thus increasing the cooling efficiency of the device.

This geometry can allow for an efficient heat transfer to the cooling fluid. First, the confinement due to the relatively small channels increases the velocity of the fluid flow and hence increases the overall cooling fluid circulation by convection. Thereby, the risk of dry out of the evaporator can be reduced. Second, the small channels increase the area of heat exchange with the flow, especially due to the side channel faces, the enlarged surface leading to a fin effect for increased heat transfer. This decreases the local heat flux (for the same power level) relative to the heat flux that would be necessary for example in a single wide channel. Further, the reduced heat flux load viewed by the cooling fluid, can allow working constantly below critical heat flux conditions. Thus, the design can lead to increased heat transfer area and confinement, which in turn can lead to a higher power density for the evaporator.

Top Collector 110

The top collector 110 can be arranged for collecting the at least partially vaporous cooling fluid exiting from the evaporation channels 130, generally as a two-phase mixture. The top collector has a separator volume that enables a separation of the liquid and gas phases of the cooling fluid (i.e. at least a partial separation of a predominantly liquid portion from a predominantly vaporous, i.e. gaseous portion). The predominantly gaseous phase can be led out via the vapor outlet port 162, which is arranged at the very top of the top collector 110, for letting the predominantly vaporous portion of the cooling fluid out of the top collector.

The liquid phase, or predominantly liquid portion, can be taken out from the top collector and can be returned to the bottom collector 150 via the liquid return channels 140 described above. To this purpose, their intakes 146 can be arranged further at the bottom of the top collector 110 than the vapor outlet port 162. Here, the return channel intakes 146 of the liquid return channels 140 can be arranged at the bottommost side of the top collector 110, and in particular further towards the bottom than the evaporation channel outlets 138 of the evaporation channel 130.

Bottom Collector:

The bottom collector can be located at the inlet ports 136 (see FIG. 3) of the evaporation channels 130. During operation, it can contain a pool of liquid cooling fluid constantly feeding the evaporator channels 130.

Figure 3:
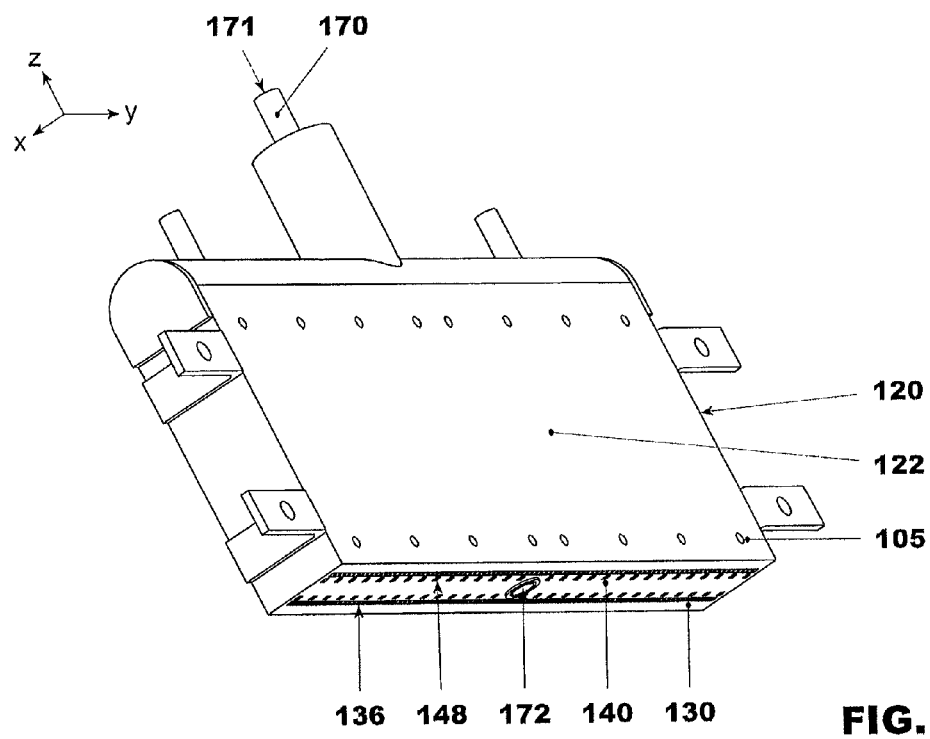
FIG. 3 is a perspective view of the evaporator of FIG. 2a being partially disassembled such as to expose the evaporator body thereof.

As can be seen in FIGS. 2a and 3, the bottom collector 150 can be fed with liquid cooling fluid from two different sources. First, it can be fed with liquid cooling fluid from the return channel outlets 148 of the liquid return channels 140. Second, it can be fed with liquid cooling fluid directly from the discharge at the top collector via the liquid outlet port 172 of the liquid return tube 170, described in more detail below. To this purpose, the liquid return tube 170 leads directly to the bottom collector 150.

The bottom collector can be fed by two sources of liquid cooling fluid. In particular, the two sources are the liquid return tube 170 directly connectable to a source outside the evaporator (here, to the condenser 300), and the return channels 140 in direct communication with the top collector 110.

Liquid Return Tube 170

The return liquid tube 170, when attached to the inner hose 220 shown in FIG. 1, can provide a direct connection between the condenser 300 (see FIG. 1) and the bottom collector 150, for delivering condensed liquid cooling fluid from the condenser to the bottom collector 150.

The liquid return tube 170 can be arranged coaxially within the outer connector tube 161 and has a liquid inlet port 171 for receiving the liquid cooling fluid coming from the top collector via the hose 220 (see FIG. 1), the inlet being arranged on a top side of the evaporator 100. The liquid return tube 170 traverses the top collector 110 and the evaporator body 120 and has a liquid outlet port 172 located directly at the bottom collector 150 for letting out the liquid cooling fluid from within the liquid return tube 170 directly to the bottom collector 150.

The liquid return tube 170 traverses through the evaporator body 120 via a cylindrical hole 176 (see FIG. 4a) extending in the z direction within the evaporator body 120. While the evaporator body 120 can be designed to receive the heat from the heat emitting device efficiently, is it not desirable that the liquid cooling fluid returning via the liquid return tube 170 should be heated too much. Such heating would slow down the liquid return to the evaporator and thereby counteract the convective circulation of the cooling fluid. Therefore, there can be a thermal insulation provided between the evaporator body 120 and the liquid return tube 170.

Here, the thermal isolation can be provided by a gap between the evaporator body 120 and the liquid return tube 170. The only mechanical contact between the liquid return tube 170 and the evaporator body 120 are two spacer rings 174, provided at the top side and at the bottom side of the evaporator body 120. The spacer rings 174, for example provided as metallic rings, provide for stable gap spacing, and at the same time keep cooling fluid from entering the gap. The spacer rings 174 can, for example, be brazed in one single shot.

Further, the liquid return tube 170 can be arranged in such a way that the evaporator channels 130 are, when seen in an x direction, between the liquid return tube 170 and the evaporator wall 122, thus further shielding the liquid return tube 170 from the heat coming from the heat emitting device 2. Alternatively, the liquid return tube can be provided as an external hose that is attached to the evaporator 100 directly at the bottom collector 150, instead of traversing the evaporator body 120.

Connector 160, Hose 200

As shown in FIGS. 2a and 2b, the vapor outlet port 162 can be provided in the outer tube 161 arranged at the top side (i.e. the side opposite to the evaporation channel outlets 138) of the top collector 110. Further, the liquid return tube 170 can be arranged as an inner tube coaxially arranged within the outer tube 161. Together, these tubes can provide a connector 160, to which the hose 200 shown in FIG. 1 can be attached.

The hose 200 can be formed correspondingly. The hose 200 has an outer hose 210 for transporting the vaporous cooling fluid from the evaporator 100 to the condenser 300, and an inner hose 220 for transporting the liquid cooling fluid back from condenser 300 to the evaporator 100, the outer and the inner hose being coaxial. The outer hose 210 can be fit to be attached to the outer connector tube 161, and the inner hose 220 can be fit to be attached to the inner connector tube 170.

The hose 200 can be rigid or flexible, for example a metallic hose or tube. The hose 200 allows the condenser 300 to be far away from the heat generating device 2. The length of the hose can be, for example, about 1 to 3 meters. The transport of the heat thorough the hose 200, out of the location at which the device to be cooled is installed, may reduce the requirement of a location ambient temperature conditioning (HVAC).

The hose 200 can be either provided alone or as part of a connection tube and may further include cables for connection to the evaporator 100 and/or to the condenser 300. The cables can be, for example, hydraulic or electric cables, for example, power or control cables.

Correspondingly, the evaporator can include, an electrical connector for electrically connecting the evaporator to at least one of an electric power and an electric signal source (not shown). The electrical connector can be attached to the connector 160 such as to be in a fixed spatial relation to the evaporator outlet tube (relative to the outer connector tube 161 or liquid return tube 170). The spatial relation can be chosen such that it fits a corresponding connector at the hose 200. In particular embodiments, the connection can be provided outside of the outer connector tube 161 and for connecting by sliding the connector relative to the hose in a direction parallel to the tube axis (in the z direction).

The hose 200 can be electrically conducting or insulating. In the former case, the hose can be grounded.

The evaporator wall 122 can be provided in a box, the box being also adapted for containing the heat generating device 2. In this case, a connection to the outside of the box may be through the hose 200 or the connector 160 going through an opening of the box.

Manufacture of the Evaporator

The evaporator 100 can be manufactured as follows. The evaporator body 120 including the channels 130, 140 and an opening 176 can be extruded (see FIG. 4a), in particular as a single block. Then, the liquid return tube 170 can be inserted into the opening 176 and attached thereto. Then, the top collector 110 (top collector housing 111) and the bottom collector 150 (bottom collector housing 151) can be attached to the evaporator body 120, for example by welding or brazing. They are attached to the evaporator body 120 in such a manner that there is a fluid-tight connection.

However, the evaporator body may also include several parts, for example a core part and lateral attached wall parts including the evaporation and/or liquid return channels that can be covered by evaporator walls in a sandwich like manner for example, in order to meet the particularities and demands. In such case, the fluid and gas tightness and function should not be affected excessively.

The evaporator body 120, the top collector 150, and/or the bottom collector 150 can be made of material including aluminum, copper, stainless steel or any other suitable thermally conductive, for example metallic material.

Attachments

FIG. 2a shows attachment wings 106 for attaching the evaporator in an operating position (with a top side being vertically upwards in the z direction, such that the evaporated cooling fluid goes upwardly). Further, there are attachment means 105 for attaching the heat emitting device 2 to the evaporator wall 122. Here, the attachment means 105 can be screw holes in the evaporator wall 122, but any other attachment means such as snap on connectors are equally suitable.

Further Modifications of Evaporator

Figure 4B:
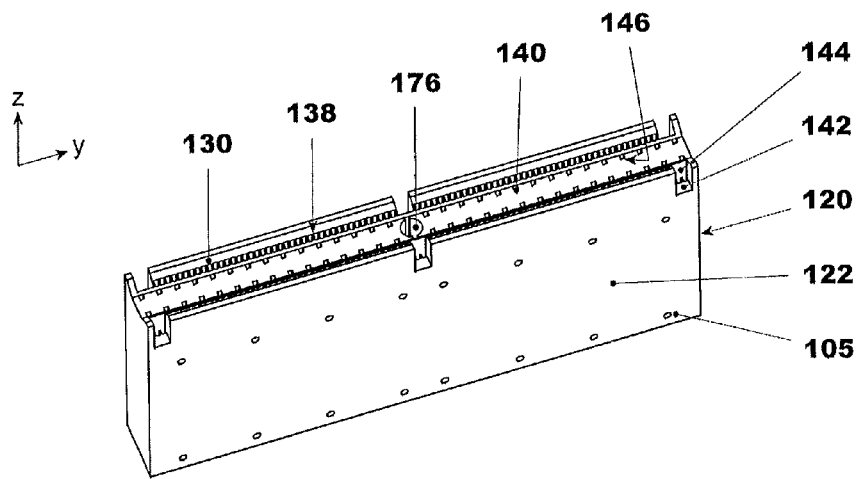
FIGS. 4b to 4d are perspective views of further evaporators according to exemplary embodiments of the disclosure.

FIG. 4b shows an evaporator body 120 for a second exemplary embodiment of the evaporator. The difference with respect to the first exemplary embodiment is that in FIG. 4b, secondary return channels 144 can be provided in a downwardly recessed portion 142 of the evaporator body 120 surface adjacent to the top collector. Thereby, the inlets of the secondary return channels 144 can be arranged more downwardly, that is closer to the bottom collector, than the return channel intakes 146 of the other liquid return channels 140. This arrangement can allow for efficient liquid return from the top collector to the bottom collector.

Figure 4C:
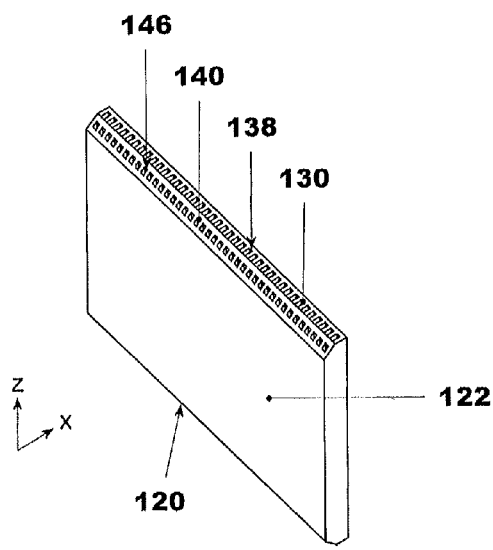

FIG. 4c shows an evaporator body 120 according to a third exemplary embodiment. Here, in contrast to the previous exemplary embodiments, the evaporator body 120 has no mirrored symmetry about a central plane, with two evaporator walls 122 at opposite sides thereof. Instead, the evaporator body has only one evaporator wall 122 adapted for being in contact with the heat dissipating device(s). Generally, the evaporator body of FIG. 4c corresponds to one half of the evaporator body of FIG. 4a (for example, the half shown in the cross-sectional view of FIG. 2b). In FIG. 4c, again the liquid return channels 140 can be arranged far away from the evaporator wall 122 than the evaporation channels 130, and the intakes 146 of the liquid return channels 140 can be further downwardly arranged in the z direction (that is closer to the bottom collector) than the evaporation channel outlets 138 of the evaporator channels 130. As a further difference with respect to the embodiment of FIG. 4a, the liquid return channels 140 can have the same number and spacing as the evaporator channels 130.

Figure 4D:
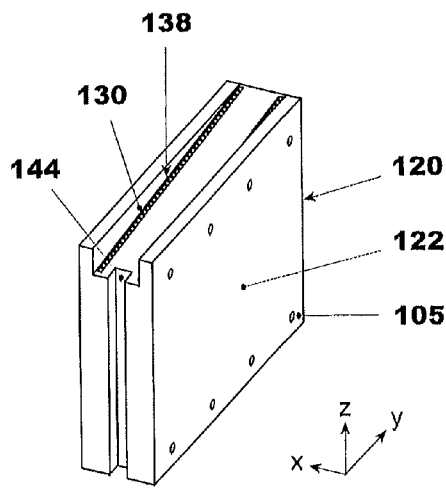

FIG. 4d shows an evaporator body 120 according to a further exemplary embodiment. Here, again two opposing evaporator walls 122 can be adapted for being attached to respective heat emitting devices. Accordingly, there are two rows of evaporator channels 130, as in for example, FIG. 4a. In contrast to the embodiment shown in FIG. 4a, there is only one liquid return channel 140. The liquid return channel 140 can be arranged between the evaporator channels 130, that is, further away from the respective evaporator wall 122 than the evaporator channels 130. Thereby, it can be thermally shielded from the heat from the heat emitting devices and the evaporator wall 122.

The top surface of the evaporator body 120, i.e. the surface adjacent to the top collector, can be at least partially sloped. The return channel intake can be arranged at a down-most side of this surface. This arrangement can result in an efficient liquid return from the top collector to the bottom collector.

A further exemplary embodiment of an evaporator body 120 can have twice the extension in the y direction as the evaporator body shown in FIG. 4d, and can be composed of two halves being as shown in FIG. 4d. The two halves can be joined at the side of the evaporator body 120 of FIG. 4d including the liquid return channel 140. Hence, in this exemplary embodiment a liquid return channel 140 can be, in the y direction, arranged in the middle of the evaporator body. The top surface has, thus, two slopes, both slopes being directed towards the return channel 140 inlet. The inlet of the liquid return channel 140 can be at the bottom-most position of the top surface of the evaporator body 120.

Mushroom Shaped Evaporator:

FIGS. 5a to 5c show, again, exemplary embodiments similar to the one shown in FIGS. 2a and 2b of an evaporator 100. In addition to the elements described with reference to FIGS. 2a and 2b, the evaporator 100 of FIGS. 5a to 5c has an enlarged reservoir volume 114 provided within the top collector 110. This reservoir volume 114 can be achieved by the top collector 110 having outwardly protruding side-walls, protruding in the x direction farther outwardly than the evaporator wall 122. Further, as can be seen in FIG. 5c, the reservoir volume 114 within the top collector 110 can extend further downwardly than the outlet 136 of the evaporation channels.

While the evaporators shown in FIGS. 5a to 5c can be combined with any evaporator body described above, in particular with anyone shown in FIGS. 4a to 4d, the evaporator body of FIG. 4b can be desirable in that it provides additional secondary liquid return channels 144 allowing for return of the liquid cooling fluids even if the cooling fluid level should be below the intakes 146 of the primary liquid return channels 140 (see FIG. 4b). In this embodiment, the intakes of the secondary return channels 144 can be roughly arranged at the bottom of the top collector reservoir volume 114.

Figure 5A:
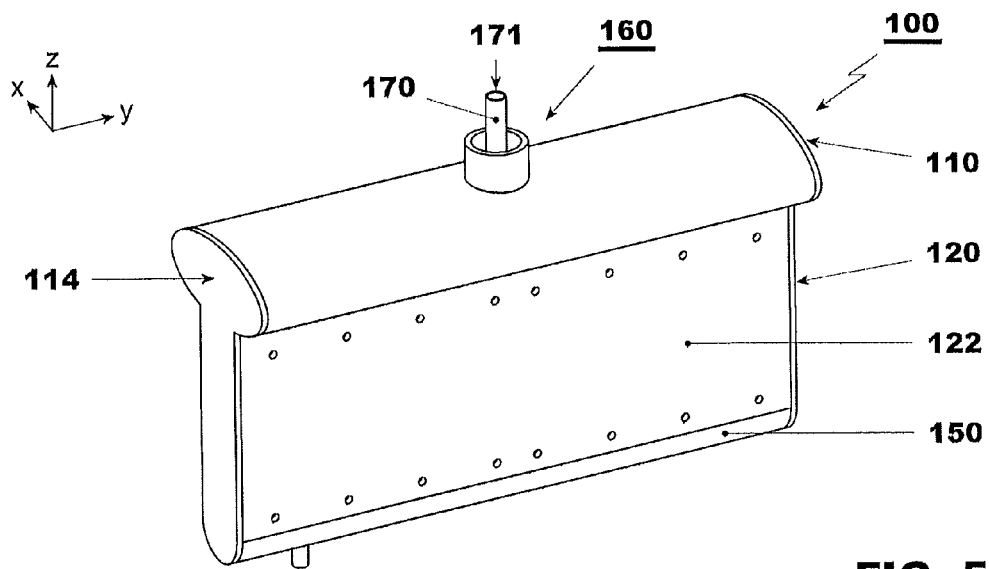
FIG. 5a is a perspective view of an evaporator according to an exemplary embodiment of the disclosure.
Figure 5B:
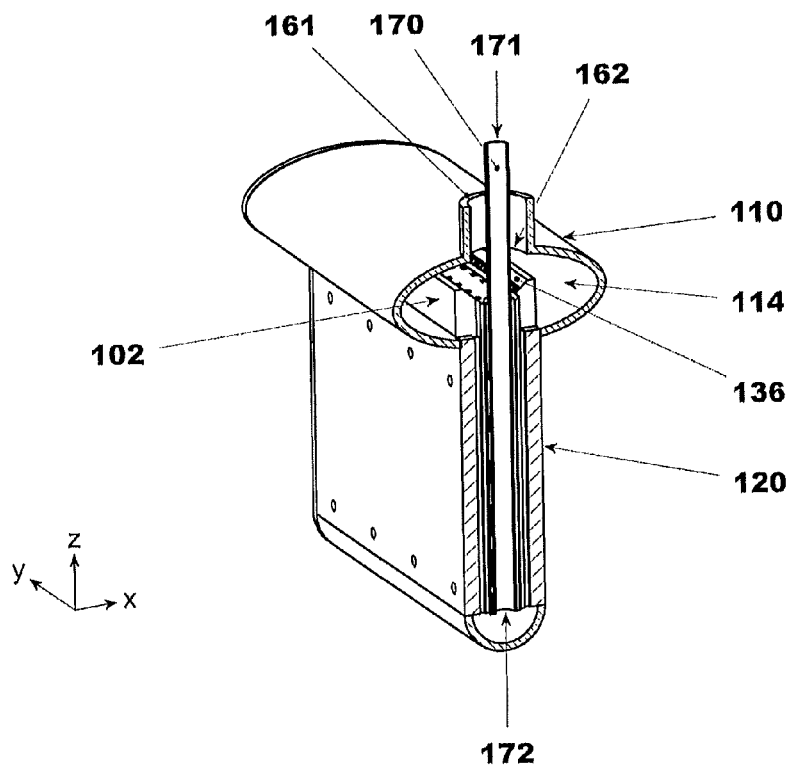

An advantage of the embodiments of FIGS. 5a and 5b can be that due to the large transverse area within the top collector reservoir volume 114, even if the absolute amount of liquid cooling fluid changes, e.g. due to tolerances or to increased evaporation (increased heat of the heat emitting device), the liquid level in z direction does not change so drastically. Thereby, even for large changes in absolute volume of the liquid portion of the cooling fluid, the liquid level can be stably kept. Thus, there can be provided a more constant liquid column to the bottom collector, close to the optimum working condition of the evaporator. Further, the risk of a possible lack of liquid cooling fluid at the evaporator entrance (dry out) can be reduced.

The top collector is shown in FIGS. 5a and 5b as having an elliptic cross section (in the x-z plane). In modifications of this embodiment, the top collector can have any other shape. For example, there may be a protrusion only at a side of the top collector facing away from the thermoconducting evaporator wall 122.

For providing a reservoir volume, the top collector 110 can have a transverse cross-sectional area (in the x-z plane) that is larger than the cross-sectional area of at least one of the evaporator body 120 and of the bottom collector 150.

Figure 7A:
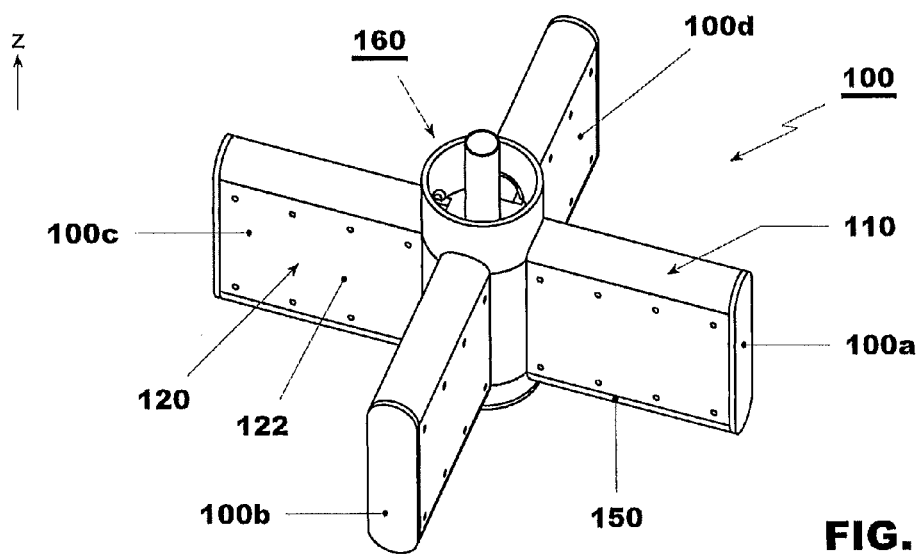
FIG. 7a is a perspective view of an evaporator according to an exemplary embodiment of the disclosure.
Figure 7B:
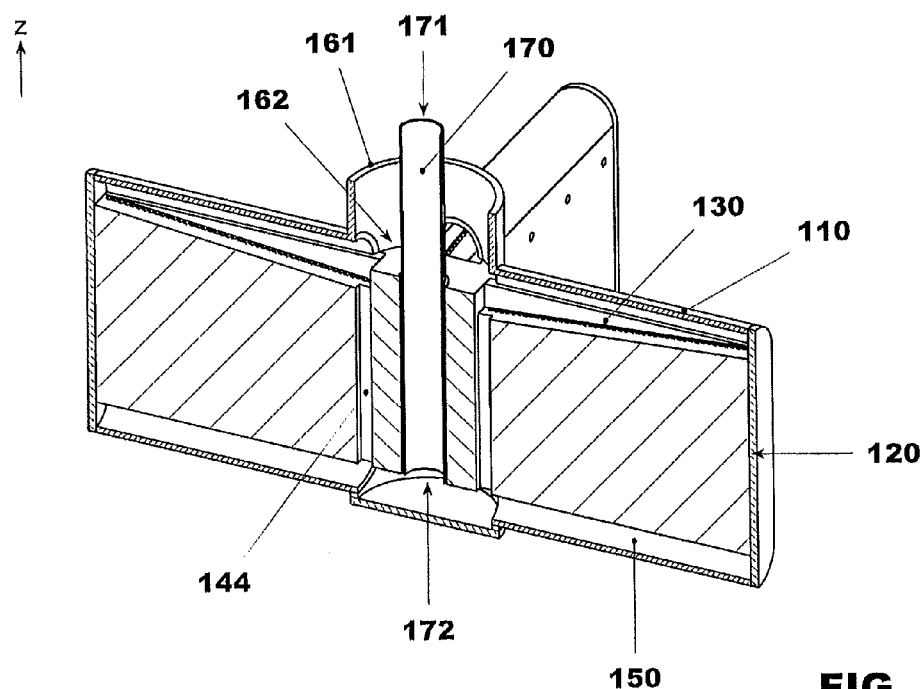

Star Shaped Evaporator:

FIG. 7a shows an evaporator according to a further exemplary embodiment. The evaporator of FIG. 7a is, further, shown in a cross-sectional view in FIG. 7b. The evaporator has four evaporator wings 100a to 100d, arranged in a cross-like arrangement around a central portion. The central portion can be a cylindrical body including the liquid return tube 170 and the outer connector tube 161 arranged coaxially around the liquid return tube 170.

The evaporator wings 100a to 100d can be arranged in a cross-like manner around the central portion and radially protruding thereof. Each evaporator wing can roughly be constructed like the evaporators described before, with two opposing evaporator walls 122 for contacting a heat emitting device thereon. The evaporator wings have a common top collector 110 and a common bottom collector 150, with evaporation channels 130 and liquid return channels 140 between them as described with respect to the previous embodiments. In the embodiment shown in FIGS. 7a and 7b, the four wings can have a common evaporator body 120 made out of one piece. However, it is also possible to have for example, a separate single piece for each evaporator wing. The evaporator body 120 corresponds, in each wing, to the embodiment shown in FIG. 4d, with one return channel 140 per wing. Alternatively, any other one of the evaporator body designs shown in FIGS. 4a to 4d, or any still other evaporator design, can be used for each wing 100a to 100d. Depending on the requirements, the evaporator body can include a plurality of parts that are thermally connected to one another in a suitable manner.

Instead of the cross-like arrangement shown in FIG. 7a, the evaporating bodies can be arranged also in other relation to each other. For example, there can be any number of fluidly connected evaporating bodies radially arranged around a center, with the evaporator outlet tube 161 being arranged at the center. For example, there can also be three evaporating bodies arranged at angles of 120° in between. This arrangement can allow for particularly convenient access to the cooled electrical devices which contributes to an easy maintenance.

Condenser:

FIGS. 6a and 6b show parts of the condenser side belonging to the condenser 300 shown in FIG. 1. In particular, there is shown a condenser inlet 212 allowing vapor to enter into the condenser (300, see FIG. 1), and a condenser outlet 222 allowing cooled liquid to exit the condenser. The condenser inlet 212 can be fluidly connected to the outer hose 210 and, via the outer hose, to the outer connector tube 161 of the evaporators (see FIGS. 2a to 5c). Similarly, the connector outlet 222 can be connected, via the inner hose 220, to the liquid return tube 170 of the evaporator (see FIGS. 2a to 5c).

The remainder of the condenser 300, see FIG. 1, is not shown in detail. Any suitable condenser, such as a plate heat exchanger or an air/liquid heat exchanger, for example, can be used.

Further, instead of a condenser, which would provide a closed cooling fluid circulation, an open cooling fluid exchanger could also be provided, in which the vaporous cooling fluid exiting the evaporator is let out to the environment, and wherein a liquid return tube 170 is simply connected to a liquid cooling fluid reservoir providing sufficient supply of fresh cooling fluid from the environment.

While the foregoing is directed to embodiments, other and further embodiments may be devised without departing from the basic scope determined by the claims.

For example, the configuration can be a single evaporator for multiple power modules or a single evaporator per module. Also, a series connection can be provided, with several evaporators sharing the same condenser, connected via individual hoses or by a common hose having multiple ports. Each evaporator can be electrically insulated from the rest though a mechanical connection made of a suitable material (like alumina or insulating ceramic materials). Also, the hose can contain at least one electrically insulating section. The electrically insulating section can be arranged such as to provide electrical insulation between an evaporator side and a condenser side of the hose, and/or such as to provide electrical insulation between different evaporator sides for respective evaporators attachable to the hose. Such a section can be the entire hose, i.e. the entire hose is made of electrically insulating material. Alternatively, the hose may include for example, a lengthwise segment of electrically insulating material, insulating the hose sides from one another. This would allow connecting different power modules having different electrical potential to the same heat removing device and keeping the elements isolated between each other. In this case, the cooling fluid should be dielectric in order to provide an electrically insulated solution.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Evaporator for a cooling circuit for cooling at least one heat emitting device by evaporation of a cooling fluid, said evaporator comprising:
    a top collector having a volume for receiving the cooling fluid therein;
    a bottom collector having a volume for receiving the cooling fluid therein;
    an evaporator body, comprising,
        at least one thermoconducting wall that is thermally connectable to the at least one heat emitting device;
        a plurality of evaporation channels being in thermal contact with the at least one thermoconducting wall and being fluidly connected to the bottom collector and to the top collector, each of the evaporation channels comprising a respective evaporation channel intake for intaking cooling fluid from the bottom collector in an operating state of the evaporator, and a respective evaporation channel outlet for letting out the cooling fluid to the top collector in the operating state,
        the evaporation channels being dimensioned for establishing boiling of the liquid cooling fluid in the evaporation channels in the operating state, so that in the operating state the cooling fluid therein is at least partially turned into vapor, and for establishing bubble pumping so that the cooling fluid is then driven out from the evaporation channels via the respective evaporation channel outlets to the top collector;
        a plurality of return channels fluidly connected to the bottom collector and to the top collector, each of the return channels comprising a respective return channel intake for intake of the cooling fluid from the top collector in the operating state, and a respective return channel outlet for letting out the cooling fluid to the bottom collector in the operating state;
    a liquid outlet port at the bottom collector for connection to a condenser of the cooling circuit for letting in cooling fluid directly from the condenser to the bottom collector in an operating state of the evaporator; and
    a vapor outlet port connectable to a condenser of the cooling circuit for letting out cooling fluid from the top collector towards the condenser in the operating state, wherein
    the top collector has a separation volume for separating, in the operating state, a predominantly liquid portion from a predominantly vaporous portion of the cooling fluid therein, and the vapor outlet port of the evaporator is arranged for letting the predominantly vaporous portion of the cooling fluid out of the top collector, and wherein the return channel intakes are arranged for taking in the predominantly liquid portion of the cooling fluid from the top collector,
        the vapor outlet port is an end portion of an outer connector tube of the evaporator,
        the liquid outlet port forms the end portion of an inner connector tube of the evaporator, and
        the outer connector tube is arranged about coaxially around the inner connector tube.

2. The evaporator of claim 1, wherein the evaporator body is provided as a single-piece unit.

3. The evaporator of claim 1, wherein the evaporation channels have a smallest transverse channel dimension with the cross section being between 0.25 mm and 25 mm.

4. The evaporator of claim 1, wherein the evaporation channels are delimited by four respective thermoconducting channel walls per channel, the channel walls extending essentially along a length of the respective evaporation channels.

5. The evaporator of claim 1, further comprising:
    at least one secondary return channel fluidly connected to the top collector and to the bottom collector, each at least one secondary return channel comprising a respective secondary return channel intake for intake of the cooling fluid from the top collector in the operating state, and a respective secondary return channel outlet for letting out the cooling fluid to the bottom collector in the operating state, the at least one secondary return channel intake being closer to the bottom collector than at least one or all of the return channel intakes.

6. The evaporator of claim 1, wherein the inner connector tube extends through the top collector and through the evaporator body to the bottom collector.

7. The evaporator of claim 1, wherein the top collector has a transverse cross-sectional area that is larger than the cross-sectional area of at least one of the evaporator body and of the bottom collector.

8. The evaporator of claim 1, wherein the at least one thermoconducting wall are two thermoconducting walls on mutually opposite sides of the evaporator body, the two thermoconducting walls being adapted to be in thermal contact with respective heat emitting devices.

9. The evaporator of claim 1, wherein the evaporator body is one of a plurality of evaporating bodies that are mutually fluidly connected and arranged radially around a center,
    wherein the outer connector tube is arranged at the center, and wherein in the plurality of evaporating bodies are four evaporating bodies arranged in a cross-shaped or star-shaped arrangement.

10. Cooling circuit for cooling at least one heat emitting device by a cooling fluid, the cooling circuit comprising:
an evaporator according to claim 1;
the condenser having a coupling portion for thermally coupling the condenser to a heat sink; and
a hose comprising a first hose portion connecting the evaporator to the condenser for delivering vaporous cooling fluid from the top collector to the condenser in the operating state and a second hose portion connecting the condenser to the evaporator for delivering liquid cooling fluid from the condenser to the bottom collector in the operating state, and wherein the hose contains at least one electrically insulating section.

11. Power module comprising at least one heat emitting device that is thermally connected to at least one evaporator body according to claim 1.

12. Power module according to claim 11, wherein the at least one heat emitting device comprises at least one of a power electronic device and a power electric device.

13. The evaporator of claim 1, wherein the evaporator channels have a smallest transverse channel dimension with a cross-section being between 0.5 mm and 10 mm.

14. The evaporator of claim 1 wherein the evaporator channels have a transverse cross-sectional aspect ratio between 1 and 10.

15. The evaporator of claim 1, wherein the evaporation channels have a transverse cross-sectional aspect ratio between 1 and 5.

16. The evaporator of claim 1, wherein the evaporator channels have a transverse cross-sectional aspect ratio between 1 and 2.

17. The evaporator of claim 3 wherein the evaporator channels have a transverse cross-sectional aspect ratio between 1 and 10.

18. The evaporator of claim 3, wherein the evaporation channels have a transverse cross-sectional aspect ratio between 1 and 5.

19. The evaporator of claim 4, wherein the evaporator channels have a transverse cross-sectional aspect ratio between 1 and 2.

20. The evaporator of claim 13, wherein the evaporator channels have a transverse cross-sectional aspect ratio between 1 and 10.

21. The evaporator of claim 13, wherein the evaporation channels have a transverse cross-sectional aspect ratio between 1 and 5.

22. The evaporator of claim 13, wherein the evaporator channels have a transverse cross-sectional aspect ratio between 1 and 2.

23. Evaporator for a cooling circuit for cooling at least one heat emitting device by evaporation of a cooling fluid, said evaporator comprising:
a top collector having a volume for receiving the cooling fluid therein;
a bottom collector having a volume for receiving the cooling fluid therein;
a liquid outlet port at the bottom collector connectable to a condenser of the cooling circuit for letting in cooling fluid from the condenser to the bottom collector in an operating state of the evaporator;
an evaporator body comprising:
at least one thermoconducting wall that is thermally connectable to the at least one heat emitting device;
at least one evaporation channel(s) being in thermal contact with the at least one thermoconducting wall and being fluidly connected to the bottom collector and to the top collector, each of the evaporation channel(s) comprising a respective evaporation channel intake for intake of the cooling fluid from the bottom collector in the operating state, and a respective evaporation channel outlet for letting out the cooling fluid to the top collector in the operating state;
at least one return channel(s) fluidly connected to the bottom collector and to the top collector, each of the return channel(s) comprising a respective return channel intake for intake of the cooling fluid from the top collector in the operating state, and a respective return channel outlet for letting out the cooling fluid to the bottom collector in the operating state; and
a vapor outlet port connectable to a condenser of the cooling circuit for letting out cooling fluid from the top collector towards the condenser in the operating state, wherein
the top collector has a separation volume for separating, in the operating state, a predominantly liquid portion from a predominantly vaporous portion of the cooling fluid therein, and the evaporator outlet port of the evaporator is arranged for letting the predominantly vaporous portion of the cooling fluid out of the top collector, and wherein the return channel intakes are arranged for taking in the predominantly liquid portion of the cooling fluid from the top collector,
the vapor outlet port is an end portion of an outer connector tube of the evaporator,
the liquid outlet port forms the end portion of an inner connector tube of the evaporator, and
the outer connector tube is arranged about coaxially around the inner connector tube.

24. The evaporator of claim 23, wherein the evaporator body is provided as a single-piece unit.

25. The evaporator of claim 23, wherein the evaporation channels have a smallest transverse channel dimension with the cross section being between 0.25 mm and 25 mm.

26. The evaporator of claim 23, wherein the evaporator channels have a smallest transverse channel dimension with a cross-section being between 0.5 mm and 10 mm.

27. The evaporator of claim 23 wherein the evaporator channels have a transverse cross-sectional aspect ratio between 1 and 10.

28. The evaporator of claim 23, wherein the evaporation channels have a transverse cross-sectional aspect ratio between 1 and 5.

29. The evaporator of claim 23, wherein the evaporator channels have a transverse cross-sectional aspect ratio between 1 and 2.

30. The evaporator of claim 25 wherein the evaporator channels have a transverse cross-sectional aspect ratio between 1 and 10.

31. The evaporator of claim 25, wherein the evaporation channels have a transverse cross-sectional aspect ratio between 1 and 5.

32. The evaporator of claim 25, wherein the evaporator channels have a transverse cross-sectional aspect ratio between 1 and 2.

33. The evaporator of claim 26, wherein the evaporator channels have a transverse cross-sectional aspect ratio between 1 and 10.

34. The evaporator of claim 27, wherein the evaporation channels have a transverse cross-sectional aspect ratio between 1 and 5.

35. The evaporator of claim 28, wherein the evaporator channels have a transverse cross-sectional aspect ratio between 1 and 2.

36. The evaporator of claim 23, further comprising:
at least one secondary return channel fluidly connected to the top collector and to the bottom collector, each at least one secondary return channel comprising a respective secondary return channel intake for intake of the cooling fluid from the top collector in the operating state, and a respective secondary return channel outlet for letting out the cooling fluid to the bottom collector in the operating state, the at least one secondary return channel intake being closer to the bottom collector than at least one or all of the return channel intakes.

37. The evaporator of claim 23, wherein the inner connector tube extends through the top collector and through the evaporator body to the bottom collector.

38. The evaporator of claim 23, wherein the top collector has a transverse cross-sectional area that is larger than the cross-sectional area of at least one of the evaporator body and of the bottom collector.

39. The evaporator of claim 23, wherein the at least one thermoconducting wall are two thermoconducting walls on mutually opposite sides of the evaporator body, the two thermoconducting walls being adapted to be in thermal contact with respective heat emitting devices.

40. The evaporator of claim 23, wherein the evaporator body is one of a plurality of evaporating bodies that are mutually fluidly connected and arranged radially around a center,
wherein the outer connector tube is arranged at the center, and
wherein in the plurality of evaporating bodies are four evaporating bodies arranged in a cross-shaped or star-shaped arrangement.

41. Cooling circuit for cooling at least one heat emitting device by evaporation of a cooling fluid, the cooling circuit comprising:
an evaporator according to claim 23;
the condenser having a coupling portion for thermally coupling the condenser to a heat sink; and
a hose comprising a first hose portion connecting the evaporator to the condenser for delivering vaporous cooling fluid from the top collector to the condenser in the operating state and a second hose portion connecting the condenser to the evaporator for delivering liquid cooling fluid from the condenser to the bottom collector in the operating state, and wherein the hose contains at least one electrically insulating section.

42. Power module comprising at least one heat emitting device that is thermally connected to at least one evaporator body according to claim 23.

43. Power module according to claim 42, wherein the at least one heat emitting device comprises at least one of a power electronic device and a power electric device.

44. The evaporator of claim 23, wherein the evaporation channels are delimited by four respective thermoconducting channel walls per channel, the channel walls extending essentially along a length of the respective evaporation channels.

45. Method of cooling a heat emitting device by an evaporator including a top collector; a bottom collector and an evaporator body with at least one thermoconducting wall, a plurality of evaporation channels and a plurality of return channels; a cooling fluid in the evaporation channels, a condenser arranged in a cooling circuit with the evaporator, a liquid outlet port at the bottom collector for connection to the condenser of the cooling circuit for letting in cooling fluid directly from the condenser to the bottom collector in an operating state of the evaporator, the method comprising:
transferring heat from the heat emitting device via the thermoconducting wall to the plurality of evaporation channels;
boiling of the liquid cooling fluid in the evaporation channels, so that the cooling fluid therein is at least partially turned into vapor and is transferred to the condenser;
bubble pumping the liquid cooling fluid in the evaporation channels, so that the cooling fluid therein is driven out from the evaporation channels to the top collector, and replaced by liquid cooling fluid entering the evaporation channels from the bottom collector;
returning a liquid portion of the cooling fluid from the top collector to the bottom collector via the plurality of return channels, wherein the liquid portion forms a predominantly liquid portion;
returning a liquid portion of the cooling fluid condensed in the condenser to the bottom collector via the liquid outlet port; and
letting out cooling fluid from the top collector towards the condenser in the operating state via a vapor outlet port connectable to a condenser of the cooling circuit, wherein
the top collector has a separation volume for separating, in the operating state, a predominantly liquid portion from a predominantly vaporous portion of the cooling fluid therein, and the vapor outlet port of the evaporator is arranged for letting the predominantly vaporous portion of the cooling fluid out of the top collector, and wherein the return channel intakes are arranged for taking in the predominantly liquid portion of the cooling fluid from the top collector,
the vapor outlet port is an end portion of an outer connector tube of the evaporator,
the liquid outlet port forms the end portion of an inner connector tube of the evaporator, and
the outer connector tube is arranged about coaxially around the inner connector tube.

* * * * *